US008902582B2

(12) United States Patent
Yalamanchili et al.

(10) Patent No.: US 8,902,582 B2
(45) Date of Patent: Dec. 2, 2014

(54) COLDPLATE FOR USE WITH A TRANSFORMER IN AN ELECTRIC VEHICLE (EV) OR A HYBRID-ELECTRIC VEHICLE (HEV)

(75) Inventors: Venkat Yalamanchili, Farmington Hills, MI (US); Rutunj Rai, Canton, MI (US)

(73) Assignee: Lear Corporation, Southfield, MI (US)

( * ) Notice: Subject to any disclaimer, the term of this patent is extended or adjusted under 35 U.S.C. 154(b) by 326 days.

(21) Appl. No.: 13/477,584

(22) Filed: May 22, 2012

(65) Prior Publication Data

US 2013/0312930 A1 Nov. 28, 2013

(51) Int. Cl.

| | |
|---|---|
| ***F28F 9/007*** | (2006.01) |
| *H05K 7/20* | (2006.01) |
| *G06F 1/20* | (2006.01) |
| *H02M 3/28* | (2006.01) |

(52) U.S. Cl.

USPC ...... 361/679.54; 361/702; 361/704; 361/705; 361/707; 361/715; 165/80.2; 165/80.3; 165/104.33; 165/185; 307/9.1; 307/10.1; 307/43; 363/64; 363/141

(58) Field of Classification Search

USPC .......... 361/679.46, 679.53, 679.54, 702, 704, 361/705, 707, 709, 710, 712, 714, 715, 719, 361/760, 766, 768; 165/80.2, 80.3, 80.4, 165/80.5, 104.33, 104.34, 67.2, 185; 257/706–727; 174/15.1, 16.3, 252; 363/64, 65, 56.02, 141–147, 137; 307/11, 38, 9.1, 10.1, 43, 82, 115; 336/60, 61, 200, 232

See application file for complete search history.

(56) References Cited

U.S. PATENT DOCUMENTS

| | | | | |
|---|---|---|---|---|
| 3,604,082 | A | 9/1971 | McBrayer et al. | |
| 3,622,846 | A | 11/1971 | Reimers | |
| 3,656,035 | A | 4/1972 | Corman et al. | |
| 4,628,407 | A | 12/1986 | August et al. | |
| 4,670,814 | A | 6/1987 | Matsui et al. | |
| 4,872,102 | A * | 10/1989 | Getter | 363/141 |
| 5,091,823 | A | 2/1992 | Kanbara et al. | |
| 5,239,443 | A | 8/1993 | Fahey et al. | |
| 5,367,437 | A | 11/1994 | Anderson | |
| 5,408,209 | A * | 4/1995 | Tanzer et al. | 336/60 |
| 5,469,124 | A * | 11/1995 | O'Donnell et al. | 336/61 |

(Continued)

FOREIGN PATENT DOCUMENTS

| | | |
|---|---|---|
| CN | 102013319 | 4/2011 |
| DE | 102007054618 A1 | 6/2008 |

(Continued)

*Primary Examiner* — Michail V Datskovskiy
(74) *Attorney, Agent, or Firm* — Brooks Kushman P.C.

(57) ABSTRACT

A coldplate for use with a transformer in an electric vehicle (EV) or a hybrid-electric vehicle (HEV). The coldplate includes a main portion having a recess formed therein, the recess having a floor configured for contacting a bottom surface of a transformer for dissipating heat generated by the transformer. The main portion includes a raised feature configured for contacting a winding of the transformer for dissipating heat generated by the transformer. The coldplate also includes a bracket member for use in securing the transformer in the recess of the main portion, the bracket member configured for contacting the main portion and the transformer for dissipating heat generated by the transformer. The bracket member includes a contact surface for contacting a top surface of the transformer, the contact surface having an area sufficient to contact substantially all of the top surface of the transformer.

20 Claims, 2 Drawing Sheets

(56) References Cited

U.S. PATENT DOCUMENTS

| | | | | |
|---|---|---|---|---|
| 5,498,030 | A | 3/1996 | Hill et al. | |
| 5,504,655 | A * | 4/1996 | Underwood et al. | 361/707 |
| 5,634,262 | A | 6/1997 | O'Donnell et al. | |
| 5,740,015 | A | 4/1998 | Donegan et al. | |
| 5,749,597 | A | 5/1998 | Saderholm | |
| 5,949,191 | A | 9/1999 | Cassese et al. | |
| 5,973,923 | A | 10/1999 | Jitaru | |
| 6,031,751 | A | 2/2000 | Janko | |
| 6,045,151 | A | 4/2000 | Wu | |
| 6,087,916 | A * | 7/2000 | Kutkut et al. | 336/61 |
| 6,144,276 | A * | 11/2000 | Booth | 336/61 |
| 6,201,701 | B1 | 3/2001 | Linden et al. | |
| 6,206,466 | B1 | 3/2001 | Komatsu | |
| 6,222,733 | B1 * | 4/2001 | Gammenthaler | 361/705 |
| 6,262,891 | B1 | 7/2001 | Wickelmaier et al. | |
| 6,313,991 | B1 | 11/2001 | Nagashima et al. | |
| 6,326,761 | B1 | 12/2001 | Tareilus | |
| 6,386,577 | B1 | 5/2002 | Kan et al. | |
| 6,430,024 | B1 | 8/2002 | Gernert | |
| 6,450,528 | B1 | 9/2002 | Suezawa et al. | |
| 6,466,441 | B1 | 10/2002 | Suzuki | |
| 6,529,394 | B1 | 3/2003 | Joseph et al. | |
| 6,819,561 | B2 | 11/2004 | Hartzell et al. | |
| 6,839,240 | B2 | 1/2005 | Skofljanec et al. | |
| 6,844,802 | B2 * | 1/2005 | Drummond et al. | 336/61 |
| 6,943,293 | B1 | 9/2005 | Jeter et al. | |
| 7,050,305 | B2 | 5/2006 | Thorum | |
| 7,109,681 | B2 | 9/2006 | Baker et al. | |
| 7,130,197 | B2 * | 10/2006 | Chin | 361/719 |
| 7,164,584 | B2 * | 1/2007 | Walz | 361/704 |
| 7,173,823 | B1 | 2/2007 | Rinehart et al. | |
| 7,204,299 | B2 | 4/2007 | Bhatti et al. | |
| 7,212,407 | B2 | 5/2007 | Beihoff et | |
| 7,236,368 | B2 | 6/2007 | Maxwell et al. | |
| 7,264,045 | B2 | 9/2007 | Mehendale et al. | |
| 7,289,329 | B2 * | 10/2007 | Chen et al. | 361/707 |
| 7,295,448 | B2 | 11/2007 | Zhu | |
| 7,375,287 | B2 | 5/2008 | Rathmann | |
| 7,375,974 | B2 | 5/2008 | Kirigaya | |
| 7,471,534 | B2 | 12/2008 | Andersson et al. | |
| 7,479,020 | B2 | 1/2009 | Whitton | |
| 7,554,817 | B2 | 6/2009 | Nakakita et al. | |
| 7,579,805 | B2 | 8/2009 | Saito et al. | |
| 7,646,606 | B2 | 1/2010 | Rytka et al. | |
| 7,660,099 | B2 | 2/2010 | Imamura et al. | |
| 7,710,723 | B2 | 5/2010 | Korich et al. | |
| 7,726,440 | B2 | 6/2010 | Aisenbrey | |
| 7,742,303 | B2 | 6/2010 | Azuma et al. | |
| 7,788,801 | B2 | 9/2010 | Oggioni et al. | |
| 7,791,887 | B2 * | 9/2010 | Ganev et al. | 361/707 |
| 7,798,833 | B2 | 9/2010 | Holbrook | |
| 7,800,257 | B2 | 9/2010 | Lu | |
| 7,804,688 | B2 | 9/2010 | Wakabayashi et al. | |
| 7,864,506 | B2 | 1/2011 | Pal et al. | |
| 7,869,714 | B2 | 1/2011 | Patel et al. | |
| 7,907,385 | B2 | 3/2011 | Korich et al. | |
| 7,920,039 | B2 * | 4/2011 | Shabany et al. | 336/61 |
| 7,952,225 | B2 * | 5/2011 | Reichard et al. | 307/10.1 |
| 7,952,876 | B2 | 5/2011 | Azuma et al. | |
| 7,957,166 | B2 | 6/2011 | Schnetzka et al. | |
| 7,974,101 | B2 | 7/2011 | Azuma et al. | |
| 8,040,005 | B2 | 10/2011 | Bhatti | |
| 8,064,198 | B2 | 11/2011 | Higashidani et al. | |
| 8,064,234 | B2 | 11/2011 | Tokuyama et al. | |
| 8,072,758 | B2 | 12/2011 | Groppo et al. | |
| 8,098,479 | B1 | 1/2012 | Parler, Jr. et al. | |
| 8,110,415 | B2 | 2/2012 | Knickerbocker et al. | |
| 8,169,780 | B2 | 5/2012 | Yoshino et al. | |
| 8,376,069 | B2 | 2/2013 | Nakatsu et al. | |
| 8,416,574 | B2 | 4/2013 | Tokuyama et al. | |
| 8,422,230 | B2 | 4/2013 | Aiba et al. | |
| 8,582,291 | B2 | 11/2013 | Nakasaka et al. | |
| 8,582,294 | B2 | 11/2013 | Guerin et al. | |
| 8,654,527 | B2 | 2/2014 | Wei et al. | |
| 8,665,596 | B2 | 3/2014 | Brereton | |
| 8,675,364 | B2 | 3/2014 | Tokuyama et al. | |
| 2002/0106414 | A1 | 8/2002 | Gernert | |
| 2002/0130495 | A1 | 9/2002 | Lotspih et al. | |
| 2003/0053298 | A1 | 3/2003 | Yamada et al. | |
| 2005/0263273 | A1 | 12/2005 | Crumly | |
| 2007/0240867 | A1 | 10/2007 | Amano et al. | |
| 2007/0246191 | A1 | 10/2007 | Behrens et al. | |
| 2008/0117602 | A1 | 5/2008 | Korich et al. | |
| 2010/0078807 | A1 | 4/2010 | Schulz | |
| 2010/0081191 | A1 | 4/2010 | Woods | |
| 2010/0157640 | A1 | 6/2010 | Azuma et al. | |
| 2010/0254093 | A1 | 10/2010 | Oota et al. | |
| 2010/0328883 | A1 | 12/2010 | Ledezma et al. | |
| 2010/0328893 | A1 | 12/2010 | Higashidani et al. | |
| 2011/0116235 | A1 | 5/2011 | Ryu et al. | |
| 2011/0214629 | A1 | 9/2011 | Benoit | |
| 2011/0235276 | A1 | 9/2011 | Hentschel et al. | |
| 2011/0267778 | A1 | 11/2011 | Eckstein et al. | |
| 2012/0031598 | A1 | 2/2012 | Han et al. | |
| 2012/0206950 | A1 | 8/2012 | Duppong et al. | |
| 2013/0039009 | A1 | 2/2013 | Shin et al. | |
| 2013/0044434 | A1 | 2/2013 | Sharaf et al. | |
| 2013/0170269 | A1 | 7/2013 | Sharaf et al. | |
| 2013/0215573 | A1 | 8/2013 | Wagner et al. | |
| 2013/0223009 | A1 | 8/2013 | Nakatsu et al. | |
| 2013/0258596 | A1 | 10/2013 | Sharaf et al. | |
| 2014/0069615 | A1 | 3/2014 | Kusaka | |

FOREIGN PATENT DOCUMENTS

| | | | | | |
|---|---|---|---|---|---|
| DE | 102008033473 | A1 | | 5/2009 | |
| EP | 1028439 | | | 8/2000 | |
| FR | 2903057 | | | 1/2008 | |
| JP | 4256397 | | | 9/1992 | |
| JP | 07297043 | A | * | 11/1995 | H01F 27/08 |
| JP | 2004254358 | A | | 9/2004 | |
| JP | 2007273774 | | | 10/2007 | |
| JP | 2008078350 | | | 4/2008 | |
| JP | 2008085168 | | | 4/2008 | |
| JP | 2011182500 | A | * | 9/2011 | H02M 3/28 |
| WO | 2010/144399 | | | 12/2010 | |
| WO | 2010144399 | | | 12/2010 | |
| WO | 2011/138156 | | | 11/2011 | |
| WO | 2011138156 | | | 11/2011 | |

* cited by examiner

COLDPLATE FOR USE WITH A TRANSFORMER IN AN ELECTRIC VEHICLE (EV) OR A HYBRID-ELECTRIC VEHICLE (HEV)

TECHNICAL FIELD

The following relates to a coldplate for use with a transformer in an electric vehicle (EV) or a hybrid-electric vehicle (HEV).

BACKGROUND

Automotive vehicles powered by an electric motor or an electric motor and a gasoline engine are commonly referred to as electric vehicles (EV) or hybrid-electric vehicles (HEV). As is well known in the art, such vehicles include batteries for supplying power to the electric motors thereof.

Electric and hybrid-electric vehicles typically provide for charging such batteries using an interface configured to rectify electrical power from a 120 volt or 240 volt alternating current (AC) utility power line for storage by the vehicle batteries. EVs and HEVs also include an inverter for use in converting the direct current (DC) voltage provided by the vehicle batteries to an AC voltage for use in powering the electric motor or motors of the vehicle. Such an inverter may comprise switching modules and a DC link capacitor.

In addition, electric and hybrid-electric vehicles may also include an auxiliary power module. Such a power module may comprise a number of electronic components, which may include transformers, capacitors, bus bars, metal-oxide-semiconductor field-effect transistors (MOSFETs) and other components.

The components of such an auxiliary power module generate heat as a result of their operations. The heat generated as a result of such operations should be dissipated so that the power module may continue to operate efficiently. Such heat generated by the operation of the power modules components may be dissipated using a coldplate provided as part of the module.

In that regard, an exemplary power converter for use in electric or hybrid-electric vehicles is shown in U.S. Pat. No. 7,974,101 entitled "Power Converter." Exemplary heat dissipating devices, as well as various features thereof, are shown in U.S. Pat. No. 7,864,506 entitled "System And Method Of Film Capacitor Cooling," U.S. Pat. No. 7,164,584 entitled "Modular Heat Sink, Electromagnetic Device Incorporating A Modular Heat Sink, And Method Of Cooling An Electromagnetic Device Using A Modular Heat Sink," U.S. Pat. No. 6,529,394 entitled "Inverter For An Electric Motor," U.S. Pat. No. 6,466,441 entitled "Cooling Device Of Electronic Part Having High And Low Heat Generating Elements," U.S. Pat. No. 6,031,751 entitled "Small Volume Heat Sink/Electronic Assembly," U.S. Patent Application Publication No. 2010/0081191 entitled "Anisotropic Heat Spreader For Use With A Thermoelectric Device," and U.S. Patent Application Publication No. 2010/0078807 entitled "Power Semiconductor Module Assembly With Heat Dissipating Element."

However, due to the heat generated as a result particularly of the operation of transformers in auxiliary power modules used in an EV or HEV, there exists a need for additional dissipation of transformer generated heat beyond that which may be provided by standard coldplates currently in use with an EV or HEV auxiliary power module. Such a coldplate would include a raised feature configured for contacting a winding of the transformer, and a bracket member configured for contacting a surface of the transformer in order to provide for additional dissipation of the heat generated by transformer operation.

SUMMARY

According to one embodiment disclosed herein, a coldplate is provided for use with a transformer in an electric vehicle (EV) or a hybrid-electric vehicle (HEV). The transformer comprises a first magnetic core, a second magnetic core and a winding, and the transformer has a top surface and a bottom surface. The coldplate comprises a main portion having a recess formed therein, the recess having a floor configured for contacting the bottom surface of the transformer for dissipating heat generated by the transformer. The main portion comprises a raised feature configured for contacting the winding of the transformer for dissipating heat generated by the transformer.

The coldplate further comprises a bracket member for use in securing the transformer in the recess of the main portion of the coldplate, the bracket member configured for contacting the main portion and the transformer for dissipating heat generated by the transformer. The bracket member has a contact surface for contacting the top surface of the transformer, the contact surface having an area sufficient to contact substantially all of the top surface of the transformer According to another embodiment disclosed herein, a heat sink is provided for use with a transformer in an electric vehicle (EV) or a hybrid-electric vehicle (HEV). The transformer comprises a winding, an upper magnetic core and a lower magnetic core, wherein the upper magnetic core forms a top surface of the transformer, the lower magnetic core forms a bottom surface of the transformer, and the upper and lower magnetic cores form a plurality of side surfaces of the transformer. The heat sink comprises a main portion having a recess formed therein, the recess having a floor configured for contacting the bottom surface of the transformer for dissipating heat generated by the transformer.

The main portion comprises a raised feature configured for contacting the winding of the transformer, wherein the winding of the transformer comprises a printed circuit board having a stamped copper coil. A portion of the winding extends beyond the side surfaces of the transformer formed by the upper and lower magnetic cores, and the portion of the winding extending beyond the side surfaces of the transformer is configured for contacting the raised feature of the main portion of the heat sink for dissipating heat generated by the transformer.

The heat sink further comprises a bracket member for use in securing the transformer in the recess of the main portion of the coldplate, the bracket member configured for contacting the main portion and the transformer for dissipating heat generated by the transformer. The bracket member has a contact surface for contacting the top surface of the transformer, the contact surface having an area sufficient to contact substantially all of the top surface of the transformer.

According to a further embodiment disclosed herein, a heat sink is provided for use with a transformer in an electric vehicle (EV) or a hybrid-electric vehicle (HEV). The transformer comprises a winding, an upper magnetic core and a lower magnetic core, wherein the upper magnetic core forms a top surface of the transformer, the lower magnetic core forms a bottom surface of the transformer, and the upper and lower magnetic cores form a plurality of side surfaces of the transformer. The heat sink comprises a main portion having a recess formed therein, the recess having a floor configured for contacting the bottom surface of the transformer for dissipating heat generated by the transformer. The main portion comprises a raised feature configured for contacting the winding of the transformer for dissipating heat generated by the transformer.

The heat sink further comprises a bracket member for use in securing the transformer in the recess of the main portion of the heat sink, the bracket member configured for contacting the main portion and the transformer for dissipating heat generated by the transformer. The bracket member has a first contact surface for contacting the top surface of the transformer, the first contact surface having an area sufficient to contact substantially all of the top surface of the transformer, and a second contact surface for contacting a side surface of the transformer, the second contact surface having an area sufficient to contact a majority of the side surface of the transformer.

The heat sink further comprises a thermal interface material interposed between the top surface of the transformer and the bracket member, and interposed between the bottom surface of the transformer and the floor of the recess. The thermal interface material is for facilitating heat conduction from the transformer to the main portion and the bracket member.

A detailed description of these embodiments of a coldplate for use with a transformer in an electric vehicle (EV) or a hybrid-electric vehicle (HEV) are set forth below together with accompanying drawings.

DETAILED DESCRIPTION

Figure 1:
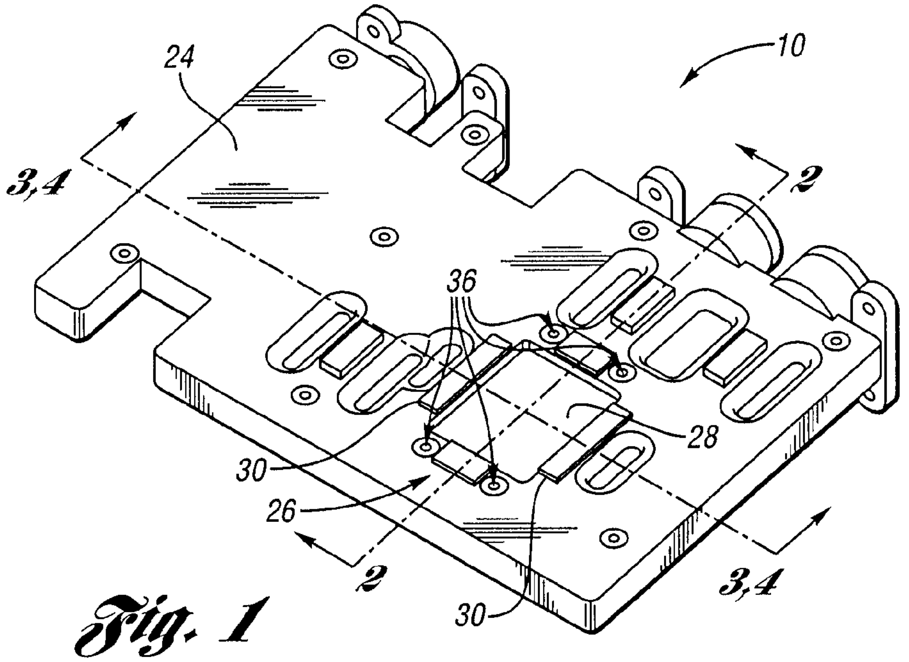
FIG. 1 is a perspective view of a coldplate for use with a transformer in an electric vehicle (EV) or a hybrid-electric vehicle (HEV) as disclosed herein.

With reference to FIGS. 1-4, a more detailed description of embodiments of a coldplate for use with a transformer in an electric vehicle (EV) or a hybrid-electric vehicle (HEV) will be described. For ease of illustration and to facilitate understanding, like reference numerals have been used herein for like components and features throughout the drawings.

As noted above, electric and hybrid-electric vehicles may include an auxiliary power module. Such a power module may comprise a number of electronic components, which may include transformers, capacitors, bus bars, metal-oxide-semiconductor field-effect transistors (MOSFETs) and other components.

The components of such an auxiliary power module generate heat as a result of their operations. The heat generated as a result of such operations should be dissipated so that the power module may continue to operate efficiently. Such heat generated by the operation of the power modules components may be dissipated using a coldplate provided as part of the module.

Exemplary heat dissipating devices, as well as various features thereof, are shown in U.S. Pat. No. 7,864,506 entitled "System And Method Of Film Capacitor Cooling," U.S. Pat. No. 7,164,584 entitled "Modular Heat Sink, Electromagnetic Device Incorporating A Modular Heat Sink, And Method Of Cooling An Electromagnetic Device Using A Modular Heat Sink," U.S. Pat. No. 6,529,394 entitled "Inverter For An Electric Motor," U.S. Pat. No. 6,466,441 entitled "Cooling Device Of Electronic Part Having High And Low Heat Generating Elements," U.S. Pat. No. 6,031,751 entitled "Small Volume Heat Sink/Electronic Assembly," U.S. Patent Application Publication No. 2010/0081191 entitled "Anisotropic Heat Spreader For Use With A Thermoelectric Device," and U.S. Patent Application Publication No. 2010/0078807 entitled "Power Semiconductor Module Assembly With Heat Dissipating Element."

There exists a need, however, for additional dissipation of transformer generated heat beyond that which may be provided by standard coldplates currently in use with an EV or HEV auxiliary power module. Such a coldplate would include a raised feature configured for contacting a winding of the transformer, and a bracket member configured for contacting a surface of the transformer in order to provide for additional dissipation of the heat generated by transformer operation.

Referring now to FIG. 1, a perspective view of a coldplate or heat sink for use with a transformer in an electric vehicle (EV) or a hybrid-electric vehicle (HEV) is shown, denoted generally by reference numeral (10). As seen therein, the coldplate (10) may have a substantially plate-like shape, although other shapes may also be employed.

Figure 2:
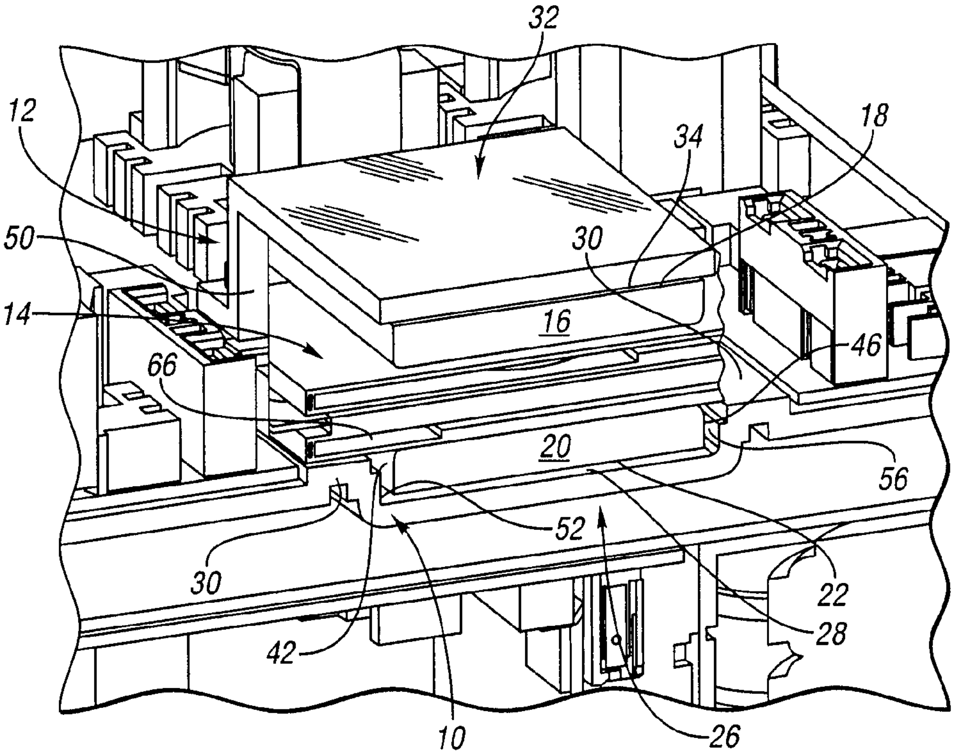
FIG. 2 is a partial perspective view of the coldplate for use with a transformer in an EV or HEV of FIG. 1, showing a cross-section of the coldplate and an associated transformer taken along the line A-A in FIG. 1, as disclosed herein.
Figure 3:
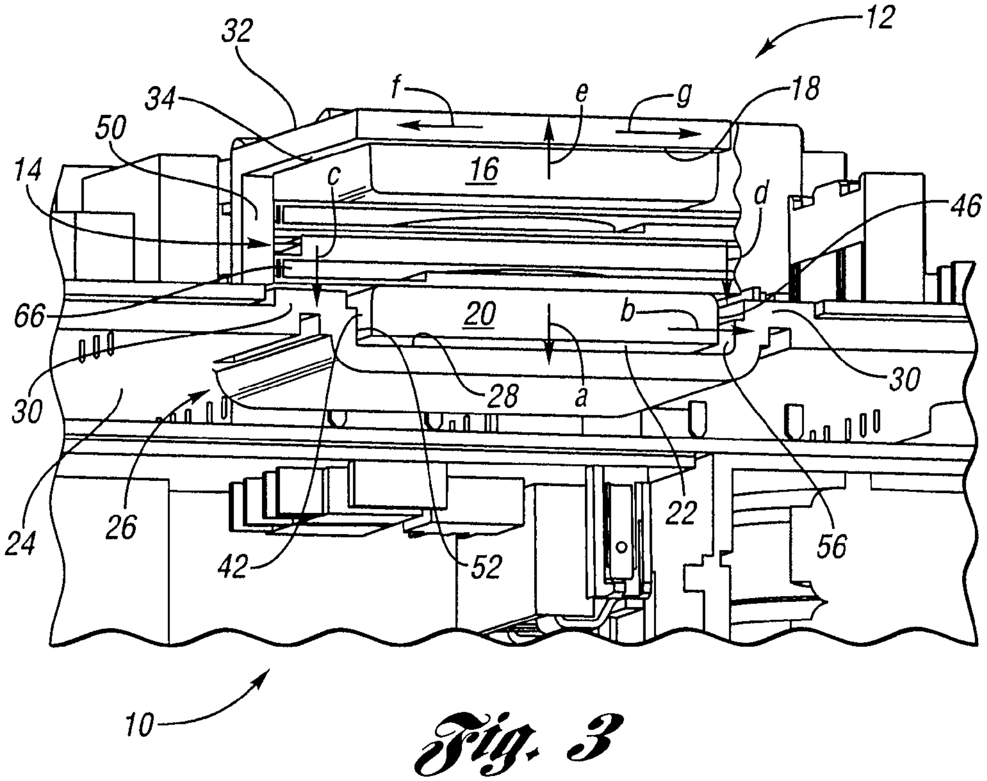
FIG. 3 is another partial perspective view of the coldplate for use with a transformer an EV or HEV of FIG. 1, again showing a cross-section of the coldplate and an associated transformer taken along the line A-A in FIG. 1, as disclosed herein.

Referring next to FIGS. 2 and 3, a partial perspective views of the coldplate (10) for use with a transformer in an EV or HEV of FIG. 1 are shown. In particular, FIGS. 2 and 3 illustrate cross-sections of the coldplate (10) and an associated transformer (12), both taken along the line A-A in FIG. 1. As seen therein, in one embodiment the transformer (12) may comprise a winding (14), an upper magnetic core (16) forming a top surface (18) of the transformer (12), and a lower magnetic core (20) forming a bottom surface (22) of the transformer (12). More generally, the transformer may comprise a winding (14) and first and second magnetic cores (16, 20), the transformer (12) having top and bottom surfaces (18, 22).

Referring now to FIGS. 1-3, the coldplate (12) may comprise a main portion (24) having a surface with a recess (26) formed therein. As previously described, the main portion (24) of the coldplate (10) may have a substantially plate-like shape, although other shapes may alternatively be employed. As will be described in greater detail below, the recess (26) formed in the main portion (24) of the coldplate (10), as well as one or more raised features (30) provided in the main portion (24), are configured for contacting a transformer (12).

The recess (26) formed in the main portion (24) may have a floor (28) configured for contacting the bottom surface (22) of the transformer (12) for dissipating heat generated by the transformer (12). The main portion (24) of the coldplate (10) may comprise at least one raised feature (30) on the surface thereof configured for contacting the winding (14) of the transformer for dissipating heat generated by the transformer (12).

The coldplate (10) may further comprise a bracket member (32) for use in securing the transformer (12) in the recess (26) of the main portion (24) of the coldplate (10). The bracket member (32) may be configured for contacting the main portion (24) as well as the transformer (12) for dissipating heat generated by the transformer (12). The bracket member (32) may be provided with a contact surface (34) for contacting the top surface (18) of the transformer (12). In that regard, the contact surface (34) of the bracket member (32) may have an area sufficient to contact substantially all of the top surface (18) of the transformer (12).

Figure 4:
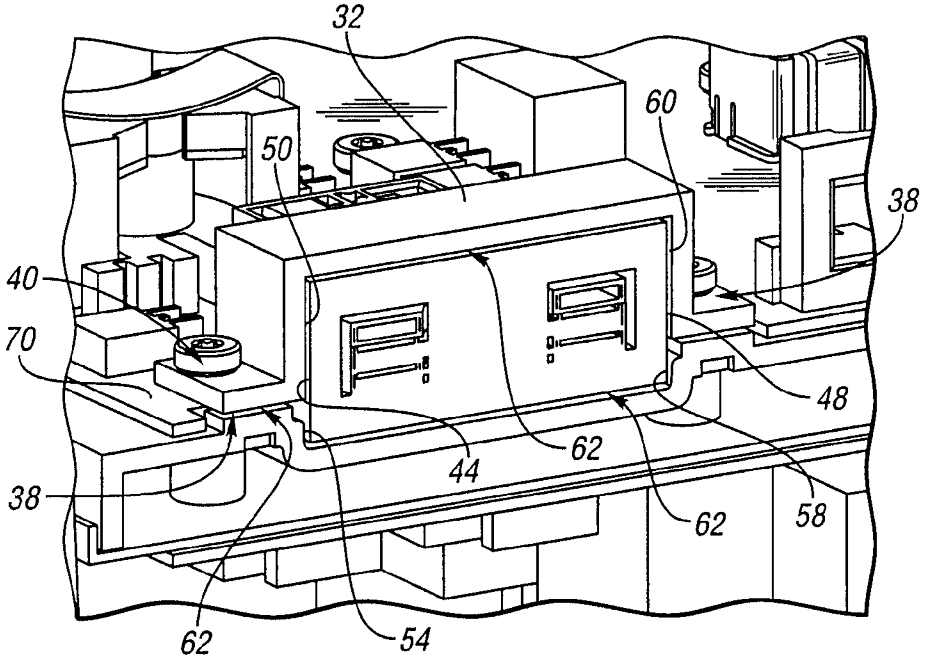
FIG. 4 is a partial perspective view of the coldplate for use with a transformer in an EV or HEV of FIG. 1, showing a cross-section of the coldplate and an associated transformer taken along the line B-B in FIG. 1, as disclosed herein.

Referring now to FIG. 4, a partial perspective view of the coldplate (10) for use with a transformer in an EV or HEV of FIG. 1 is shown. In particular, FIG. 4 illustrates a cross-section of the coldplate (10) and an associated transformer taken along the line B-B in FIG. 1.

As seen therein, the main portion (24) of the coldplate (10) may further comprise an attachment feature (36) on a surface thereof. The bracket member (32) may likewise comprise an attachment feature (38) for cooperating with the attachment feature (36) of the main portion (24) for use in attaching the bracket member (32) to the main portion (24). As depicted in FIG. 4, the attachment features (36, 38) of the main portion (24) and the bracket member (32) may take the form of openings formed therein for use with a fastener (40), such as a screw, bolt, or any other fastener type or means. It should be noted, however, that any other types of attachment features known in that art may alternatively be employed.

Referring now to FIGS. 2-4, the upper and lower (or first and second) magnetic cores (16, 20) of the transformer (12) may form a plurality of side surfaces (42, 44, 46, 48) of the transformer (12). As well, the recess (26) formed in the main portion (24) may have a plurality of side surfaces (52, 54, 56, 58) configured for contacting the plurality of side surfaces (42, 44, 46, 48) of the transformer (12) for dissipating heat generated by the transformer (12).

Similarly, the bracket member (32) may be provided with one or more further contact surfaces (50, 60) configured for contacting one or more side surfaces (52, 56) of the transformer (12) for dissipating heat generated by the transformer (12). In that regard, the further contact surfaces (50, 60) of the bracket member (32) may be provided with an area sufficient to contact a majority of the side surfaces (52, 56) of the transformer (12).

It should be noted that the top, bottom and side surfaces (18, 22, 52, 54, 56, 58) of the transformer (12) may be configured for direct contact with the floor (28) of the recess (26) and the contact surfaces (34, 50, 60) of the bracket member (32). Alternatively, or in addition, the top, bottom and side surfaces (18, 22, 52, 54, 56, 58) of the transformer (12) may be configured for indirect contact with the floor (28) of the recess (26) and the contact surfaces (34, 50, 60) of the bracket member (32).

In regard to such indirect contact, referring now to FIG. 4, a thermal interface material (62) may be interposed in gaps between any of the top, bottom and side surfaces (18, 22, 42, 44, 46, 48) of the transformer (12) and the floor (28) of the recess (26) or the contact surfaces (34, 50, 60) of the bracket member (32). In such a fashion, the thermal interface material (62) facilitates heat conduction or transfer from the transformer (12) to the coldplate (10), and may comprise any suitable thermally conductive material known in the art.

Referring again to FIGS. 2 and 3, the winding (14) of the transformer (12) may comprise a printed circuit board (64) having a stamped copper coil. A portion (66) of the winding (14) may extend beyond the side surfaces (52, 54, 56, 58) of the transformer (12) formed by the upper and lower (or first and second) magnetic cores (16, 20). The portion (66) of the winding (14) extending beyond the side surfaces (42, 44, 46, 48) of the transformer (12) may be configured for contacting one or more of the raised features (30) of the main portion (24) of the coldplate (10) for further dissipating heat generated by the transformer (12).

Thus, as can be seen in FIGS. 2 and 3, three or more sides of the lower magnetic core (20) of the transformer (12) make direct or indirect contact with the coldplate (10), thereby improving heat transfer from the core (20) of the transformer (12) to the coldplate (10) (see arrows (a) and (b)). In addition, the winding (14) also makes contact with the raised features (30) of the coldplate (10), thereby improving heat transfer from the winding (14) to the coldplate (10) (see arrows (c) and (d)). As well, the upper magnetic core (16) of the transformer (12) makes direct or indirect contact with the coldplate (10) via the bracket member (32) (see arrows (e), (f) and (g)). In that regard, as seen in FIG. 4, the bracket member (32) makes direct or indirect contact with the coldplate (10) via the cooperation of their respective attachment features (36, 38) and fastener (40), which also may function for holding printed circuit board (PCB) (70).

As is readily apparent from the foregoing, a coldplate for use with a transformer in an electric vehicle (EV) or a hybrid-electric vehicle (HEV) has been described. The embodiments of the coldplate described provide for additional dissipation of transformer generated heat beyond that which may be supplied by a standard coldplate used with an EV or HEV auxiliary power module. Such embodiments include a coldplate would include a raised feature configured for contacting a winding of the transformer, and a bracket member configured for contacting a surface of the transformer in order to provide for additional dissipation of the heat generated by transformer operation.

While various embodiments of a coldplate for use with a transformer in an electric vehicle (EV) or a hybrid-electric vehicle (HEV) have been illustrated and described herein, they are exemplary only and it is not intended that these embodiments illustrate and describe all those possible. Instead, the words used herein are words of description rather than limitation, and it is understood that various changes may be made to these embodiments without departing from the spirit and scope of the following claims.

What is claimed is:

1. A coldplate for use with a transformer in an electric vehicle (EV) or a hybrid-electric vehicle (HEV), the transformer comprising a first magnetic core, a second magnetic core and a winding, the transformer having a top surface and a bottom surface, the coldplate comprising:

a main portion having a recess formed therein, the recess having a floor configured for contacting the bottom surface of the transformer for dissipating heat generated by the transformer, the main portion comprising a raised feature configured for contacting the winding of the transformer for dissipating heat generated by the transformer; and a bracket member for use in securing the transformer in the recess of the main portion of the coldplate, the bracket member configured for contacting the main portion and the transformer for dissipating heat generated by the transformer, the bracket member having a contact surface for contacting the top surface of the transformer, the contact surface having an area sufficient to contact substantially all of the top surface of the transformer.

2. The coldplate of claim 1 wherein the main portion further comprises an attachment feature, and the bracket member comprises an attachment feature for cooperating with the attachment feature of the main portion for use in attaching the bracket member to the main portion.

3. The coldplate of claim 1 wherein the transformer has a plurality of side surfaces and the recess formed in the main portion has a plurality of side surfaces configured for contacting the plurality of side surfaces of the transformer for dissipating heat generated by the transformer.

4. The coldplate of claim 3 wherein the bracket member has a further contact surface for contacting a side surface of the transformer for dissipating heat generated by the transformer, the further contact surface having an area sufficient to contact a majority of the side surface of transformer.

5. The coldplate of claim 1 wherein transformer has a plurality of side surfaces and the bracket member has a further contact surface for contacting a side surface of the transformer for dissipating heat generated by the transformer, the further contact surface having an area sufficient to contact a majority of the side surface of the transformer.

6. The coldplate of claim 1 wherein the top and bottom surfaces of the transformer are configured for direct contact with the bracket member and the floor of the recess.

7. The coldplate of claim 1 wherein the top and bottom surfaces of the transformer are configured for indirect contact with the bracket member and the floor of the recess.

8. The coldplate of claim 7 further comprising a thermal interface material interposed between the top surface of the transformer and the bracket member, and interposed between the bottom surface of the transformer and the floor of the recess, the thermal interface material for facilitating heat conduction from the transformer to the coldplate.

9. The coldplate of claim 3 wherein the winding of the transformer comprises a printed circuit board having a stamped copper coil, a portion of the winding extends beyond the side surfaces of the transformer, and the portion of the winding extending beyond the side surfaces of the transformer is configured for contacting the raised feature of the main portion of the coldplate for dissipating heat generated by the transformer.

10. A heat sink for use with a transformer in an electric vehicle (EV) or a hybrid-electric vehicle (HEV), the transformer comprising a winding, an upper magnetic core and a lower magnetic core, wherein the upper magnetic core forms a top surface of the transformer, the lower magnetic core forms a bottom surface of the transformer, and the upper and lower magnetic cores form a plurality of side surfaces of the transformer, the heat sink comprising:

a main portion having a recess formed therein, the recess having a floor configured for contacting the bottom surface of the transformer for dissipating heat generated by the transformer, the main portion comprising a raised feature configured for contacting the winding of the transformer, wherein the winding of the transformer comprises a printed circuit board having a stamped copper coil, a portion of the winding extends beyond the side surfaces of the transformer formed by the upper and lower magnetic cores, and the portion of the winding extending beyond the side surfaces of the transformer is configured for contacting the raised feature of the main portion of the heat sink for dissipating heat generated by the transformer; and a bracket member for use in securing the transformer in the recess of the main portion of the coldplate, the bracket member configured for contacting the main portion and the transformer for dissipating heat generated by the transformer, the bracket member having a contact surface for contacting the top surface of the transformer, the contact surface having an area sufficient to contact substantially all of the top surface of the transformer.

11. The heat sink of claim 10 wherein the bracket member has a further contact surface for contacting a side surface of the transformer for dissipating heat generated by the transformer, the further contact surface having an area sufficient to contact a majority of the side surface of the transformer.

12. The heat sink of claim 10 wherein the top and bottom surfaces of the transformer are configured for direct contact with the bracket member and the floor of the recess.

13. The heat sink of claim 10 wherein the top and bottom surfaces of the transformer are configured for indirect contact with the bracket member and the floor of the recess.

14. The heat sink of claim 13 further comprising a thermal interface material interposed between the top surface of the transformer and the bracket member, and interposed between the bottom surface of the transformer and the floor of the recess, the thermal interface material for facilitating heat conduction from the transformer to the coldplate.

15. The heat sink of claim 10 wherein the main portion has a substantially plate-like shape.

16. A heat sink for use with a transformer in an electric vehicle (EV) or a hybrid-electric vehicle (HEV), the transformer comprising a winding, an upper magnetic core and a lower magnetic core, wherein the upper magnetic core forms a top surface of the transformer, the lower magnetic core forms a bottom surface of the transformer, and the upper and lower magnetic cores form a plurality of side surfaces of the transformer, the heat sink comprising:

a main portion having a recess formed therein, the recess having a floor configured for contacting the bottom surface of the transformer for dissipating heat generated by the transformer, the main portion comprising a raised feature configured for contacting the winding of the transformer for dissipating heat generated by the transformer;

a bracket member for use in securing the transformer in the recess of the main portion of the heat sink, the bracket member configured for contacting the main portion and the transformer for dissipating heat generated by the transformer, the bracket member having a first contact surface for contacting the top surface of the transformer, the first contact surface having an area sufficient to contact substantially all of the top surface of the transformer, and a second contact surface for contacting a side surface of the transformer, the second contact surface having an area sufficient to contact a majority of the side surface of the transformer; and a thermal interface material interposed between the top surface of the transformer and the bracket member, and interposed between the bottom surface of the transformer and the floor of the recess, the thermal interface material for facilitating heat conduction from the transformer to the main portion and the bracket member.

17. The heat sink of claim 16 wherein the main portion has a substantially plate-like shape.

18. The heat sink of claim 16 wherein the main portion further comprises an attachment feature on the surface thereof, and the bracket member comprises an attachment feature for cooperating with the attachment feature of the main portion for use in attaching the bracket member to the main portion.

19. The heat sink of claim 16 wherein the recess formed in the main portion has a plurality of side surfaces configured for contacting the plurality of side surfaces of the transformer for dissipating heat generated by the transformer.

20. The heat sink of claim 16 wherein the winding of the transformer comprises a printed circuit board having a stamped copper coil, a portion of the winding extends beyond the side surfaces of the transformer formed by the upper and lower magnetic cores, and the portion of the winding extending beyond the side surfaces of the transformer is configured for contacting the raised feature of the main portion of the heat sink for dissipating heat generated by the transformer.

* * * * *